United States Patent [19]

James

[11] 3,821,777

[45] June 28, 1974

[54] AVALANCHE PHOTODIODE

[75] Inventor: Lawrence W. James, Palo Alto, Calif.

[73] Assignee: Varian Associates, Palo Alto, Calif.

[22] Filed: Sept. 22, 1972

[21] Appl. No.: 291,456

[52] U.S. Cl. .................... 357/39, 357/16, 357/13, 357/61

[51] Int. Cl. .................... H01l 15/00

[58] Field of Search... 317/235 N, 235 AC, 235 AP; 148/1.5

[56] References Cited

UNITED STATES PATENTS

| | | | |
|---|---|---|---|
| 3,534,231 | 10/1970 | Beard | 317/235 |
| 3,537,029 | 10/1970 | Kressel | 331/94.5 |
| 3,560,275 | 2/1971 | Kressel | 148/171 |

OTHER PUBLICATIONS

Shih et al., I.B.M. Tech. Discl. Bull. Vol. 11, No. 12, May 1969.

*Primary Examiner*—Martin H. Edlow
*Attorney, Agent, or Firm*—Stanley Z. Cole; Paul Hentzel

[57] ABSTRACT

An avalanche photodiode, particularly useful for detection of infrared energy in the wavelength region from 1 to 2 microns, includes an active epitaxial layer of a quaternary III-V alloy such as n-$In_{1-y}Ga_yP_{1-x}As_x$. The active layer interfaces with a second lattice matched epitaxial layer of p-type material to define a lattice matched p-n junction therebetween which is reverse biased, in use. The active layer has a direct bandgap energy less than the photon energy of the infrared energy to be detected for absorption of the photons to be detected to generate electron-hole pairs. The active layer is made of a material having an energy difference between the lowest conduction band minimum and the next higher conduction band minima either $X_1$ or $L_1$ which is greater than 1.1 times the direct bandgap energy of the active layer, whereby improved signal to noise ratio is obtained.

10 Claims, 9 Drawing Figures

AVALANCHE PHOTODIODE

DESCRIPTION OF THE PRIOR ART

Heretofore, avalanche infrared photodiodes have employed ternary III-V alloy active layers of GaAsSb grown upon a binary III-V alloy substrate of GaAs. Such prior art avalanche photodiodes have been plagued with excessive noise from two sources. A first source of noise comes about because the average multiplication gain for the avalanche diode varies as a function of position over the p-n junction area due to junction nonuniformities. Secondly, the distribution of the actual gain for each photoelectron, at a given point in the junction, is very wide due to the statistics of the avalanche multiplication process.

In these prior art infrared detectors, the active ternary material had a lattice constant substantially different than that of the binary substrate, i.e. approximately 1% mismatch. This mismatch in lattice constants caused dislocations to be introduced during the material growth. These dislocations make it extremely difficult to obtain uniform junctions. Nonuniform junctions cause nonuniform average multiplication as a function of position over junction area, thereby constituting the first source of noise previously discussed.

SUMMARY OF THE PRESENT INVENTION

The principal object of the present invention is the provision of an improved avalanche photodiode sensitive to infrared radiation in the 1 to 2 micron wavelength region.

In one feature of the present invention, the active layer of the photodiode, in which infrared photons are absorbed to generate electron-hole pairs, is made of a material having an energy difference $E_{\Gamma X}$ and $E_{\Gamma L}$ between the lowest conduction band minimum ($\Gamma_1$) and the next higher conduction band minima either $X_1$ or $L_1$ which is greater than 1.1 times the direct bandgap energy of the active layer, whereby the active layer of the avalanche photodiode has a favorable band structure resulting in an improvement in the distribution of gain, that is, a smaller spread in the number of electrons out of the device into the external circuit for one electron entering the avalanche region, whereby improved signal to noise ratio is obtained.

In another feature of the present invention, the active layer of the avalanche photodiode is made of a quaternary III-V alloy of $In_{1-y}Ga_yP_{1-x}As_x$, where $y$ falls within the range of 0.6 and 0 and $x$ falls within the range of 0.45 to 1, whereby the active layer has a favorable band structure for improved signal to noise ratio.

In another feature of the present invention, the active layer and adjoining interfacing layer, defining the p-n junction, are grown upon a common substrate such substrate having a lattice constant matched to the latter constant of the active p-n junction forming layers, whereby highly uniform junctions are obtained to yield uniform average gain across the junctions resulting in improved signal to noise ratio.

In another feature of the present invention, the substrate is InP having a bandgap energy above the photon energy of the infrared radiation to be detected and the active p-n junction forming layers are made of a quaternary III-V alloy of InGaPAs proportioned to have a bandgap energy below the photon energy of the infrared energy to be detected, whereby the substrate is transparent to the infrared photon energy to be detected.

Other features and advantages of the present invention will become apparent upon a perusal of the following specification taken in connection with the accompanying drawings wherein:

DESCRIPTION OF THE PREFERRED EMBODIMENTS

Figure 1:
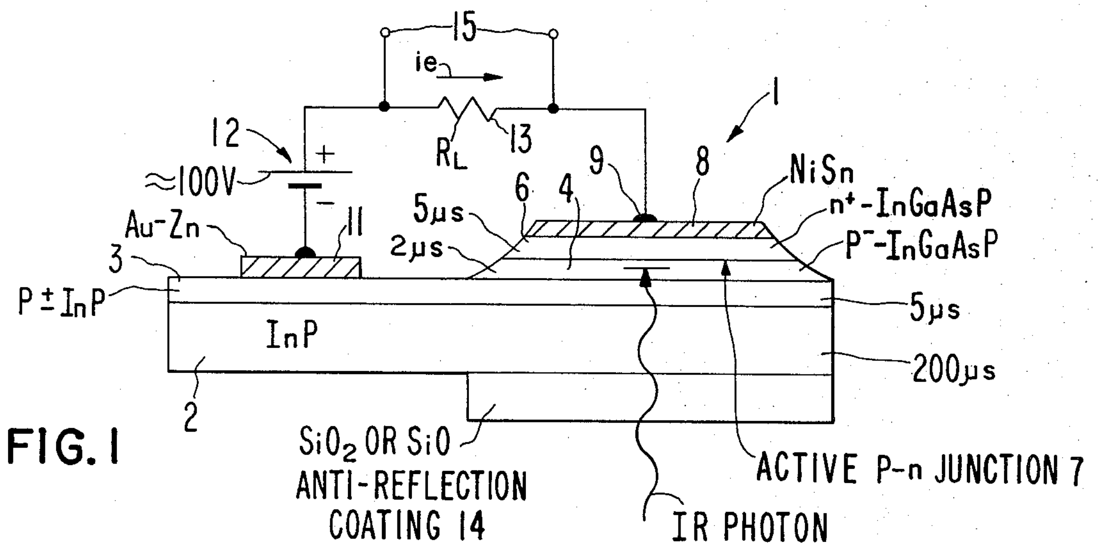
FIG. 1 is a schematic sectional view of an avalanche photodiode incorporating features of the present invention.

Referring now to FIG. 1, there is shown an infrared sensitive low noise avalanche photodiode 1 incorporating features of the present invention. More particularly, the avalanche diode 1 includes a single crystal substrate 2, as of 200 microns thick, and made of a material transparent to the infrared radiation to be detected. This requires that the substrate material have a bandgap energy above the photon energy of the infrared photons to be detected. For detection of photons corresponding to wavelengths in the 1 to 2 micron region a particularly suitable substrate material is the binary III-V alloy of InP which is preferably undoped to minimize free carrier absorption.

A heavily p-doped (p-dopant concentration $\approx 3 \times 10^{18}/cm^3$) epitaxial layer 3, as of five microns thick, is grown upon the substrate 2 to provide an electrical contact region to an active layer 4 of the diode 1. A particularly suitable material for the electrical contact layer 3, when the substrate is InP, is InP where layer 3 is lattice matched to layer 2 and has a desirable bandgap energy (i.e. greater than the photon energy to be detected) to minimize absorption of photon energy to be detected.

Lattice matching to the substrate eliminates lattice dislocations that could otherwise propagate through the sandwich like structure to produce junction non-uniformities.

A uniform junction reduces the distribution of average multiplication as a function of position over the junction area, thereby reducing the first source of noise previously discussed. Thus, lattice matching at the junction of layer 4 to the substrate will give few dislocations which will result in higher uniform junctions and uniform average gain across the junction.

The active layer 4 is preferably lattice matched to the substrate 2 and to the electrical contact region 3 of the substrate and is made of a material having a bandgap energy slightly less than the lowest photon energy of the infrared photons to be detected, such that the photons passing through the substrate will be absorbed in the active layer 4 for generation of electron-hole pairs.

A particularly suitable active layer 4 is a lightly p-doped (i.e. p-dopant concentration $\approx 10^{16}/cm^3$) quaternary III-V alloy of InGaAsP having its constituents proportioned for lattice matching to the InP substrate and with the constituents also proportioned to provide the desired direct bandgap below the photon energy to be detected. This material is also particularly desirable in that it has a desirable band structure wherein the energy difference $E_{\Gamma L}$ or $E_{\Gamma X}$ between the lowest conduction band minimum ($\Gamma_1$) and the next higher conduction band minima, either the $X_1$ or $L_1$ minima, which is greater than 1.1 times the direct bandgap energy of the active layer, whereby the conditions for low noise avalanche gain are achieved, as more fully described below, and whereby the second source of noise is minimized. A particularly suitable composition for the active layer utilized in combination with an InP substrate is that as shown by the cross-hatched region 5 of line 23 of FIG. 7, and particularly the point marked A along that line having a composition as follows: $In_{0.53}Ga_{0.47}As_{0.89}P_{0.11}$.

The active layer 4 is the layer in which the photon absorption takes place. It must be thick enough so that almost all of the light is absorbed in this region, otherwise excess noise will be generated due to the differing multiplication gain for holes generated in the overlying n-type region. The actual thickness, T, and doping density of layer 4 is optimized to provide maximum demodulation frequency response.

A p-n junction forming heavily n-doped (i.e. n dopant concentration $\approx 10^{18}/cm^3$) epitaxial layer 6 is formed overlaying and interfacing with the active layer 4 to define an active p-n junction 7 between layers 4 and 6. Epitaxial layer 6, in a typical example, is 5 microns thick and preferably made of an n-doped material having a lattice constant matched to that of the active layer 4 to achieve an extremely uniform junction 7. In the above example, layer 6 has a composition as follows: $In_{0.53}Ga_{0.47}As_{0.89}P_{9.11}$.

An n-type ohmic metallic electrode 8 as of Ni-Sn alloy is formed overlaying the junction forming layer 6. Electrical contact is made to electrode 8 at 9. Similarly, a suitable p-type ohmic contact electrode 11, as of an alloy of Au and Zn, is formed on the *p+* layer 3 and an electrical circuit consisting of a source of potential 12 as of 100 volts and a series load resistor $R_L$ 13 is connected in series with the contacts 8 and 11 for reverse biasing the active p-n junction 7. An anti-reflection coating 14, as of $SiO_2$ or SiO, is formed on the substrate 2 along the beam path for the photons to be detected for minimizing the reflection of photons fromthe diode 1. The device is etched to form the conventional mesa configuration.

Figure 9:
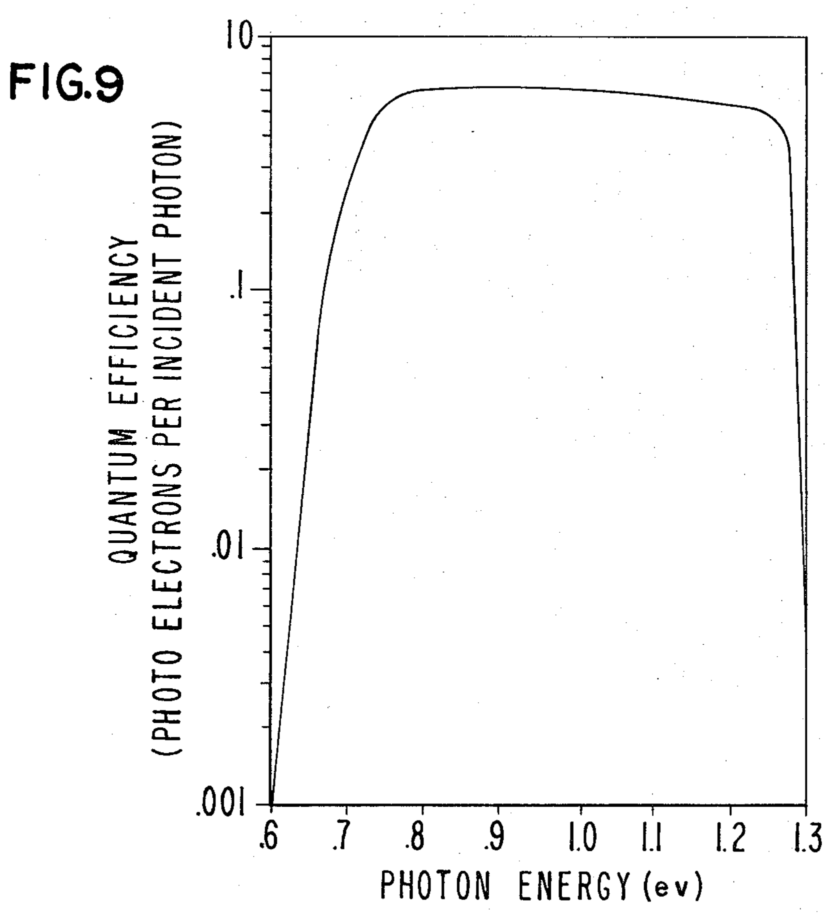
FIG. 9 is a plot of photo electron yield per incident photon vs. photon energy for the photodiode of FIG. 1.

In operation, infrared photon energy having wavelengths in the range of 1 to 2 microns pass through the anti-reflection coating 14, substrate 2, conductive region 3, and into the active layer 4 wherein they are absorbed to produce electron-hole pairs. The electrons are accelerated across the reverse bias potential of the p-n junction and generate extra electron-hole pairs due to ionization. The carriers are swept out of the junction and cause a current to flow in the external circuit through the load resistor $R_L$ 13 as detected current I producing an output voltage across terminals 15. The avalanche diode 1 of FIG. 1, which incorporates features of the present invention, provides improved signal to noise ratio and has a quantum efficiency of approximately 70 percent, as shown in FIGS. 9.

Use of InGaAsP lattice matched to the substrate as the active layer 4 has several advantages over the prior ternary III-V alloy active layers formed on binary III-V substrates. This quaternary material has an extra degree of freedom, as contrasted with the ternary material, in that the bandgap and lattice constant can be independently specified (within a given range). Thus, the bandgap energy of the active layer can be chosen to optimize performance at the desired wavelength and the lattice constant of the active layer can be chosen to provide a lattice match to the binary substrate material and to the p-n junction forming layer, thus, giving uniform junctions and uniform gain.

Figure 2:
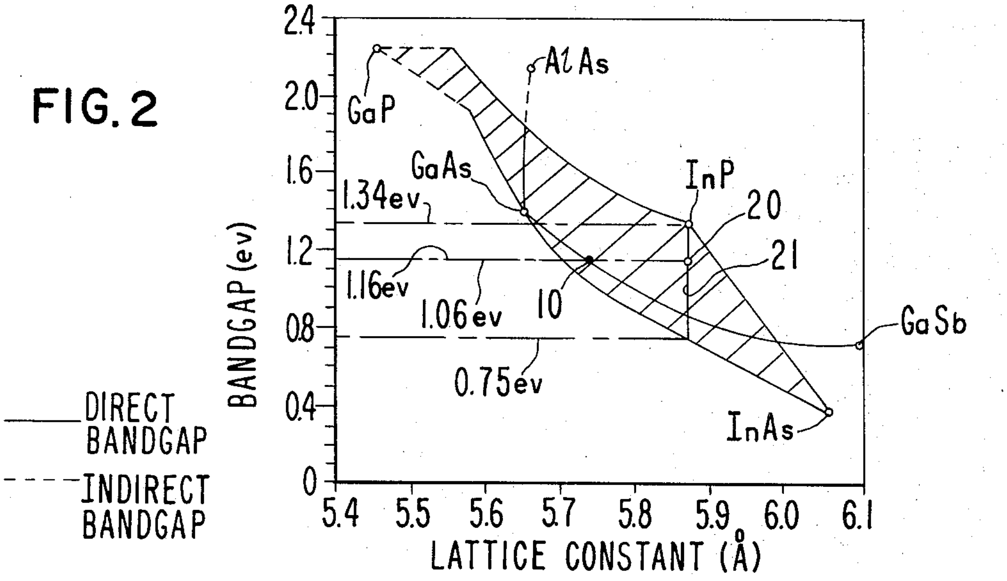
FIG. 2 is a plot of bandgap energy in electron volts vs. lattice constant in angstroms showing the diagram for the quaternary III-V alloy of GaInAsP and the direct and indirect bandgap regions thereof.

This can be seen by examination of FIG. 2 which plots the bandgap as a function of lattice constant for some III-V materials including the subject quaternary material. The binary materials, which are commercially available in suitable form for use as substrate material, are shown as the small open circles in FIG. 2. The ternary materials such as InGaAs, GaAsSb, and InAsP are shown by the curved lines connecting the two binary end points. Notice that for any of the ternary materials (except GaAlAs which has too high a bandgap range to be of interest as an infrared detector) a change in bandgap requires a significant change in lattice constant. For example, an avalanche photodiode designed for 1.06 micron operation which uses GaAsSb grown on a GaAs substrate requires GaAsSb with a bandgap of about 1.1 eV (indicated as point 10 on FIG. 2). This material has a lattice constant of greater than 5.7 angstroms giving a lattice mismatch of 1 percent or more to the GaAs substrate.

The InGaAsP quaternary is represented in FIG. 2 by the shaded area. A unique composition of InGaAsP exists which gives the lattice constant and bandgap energy specified by any point within the indicated area. For example, in the case of a 1.16 eV bandgap material, required as in the example above, it is possible to choose a material with this bandgap and with a lattice constant exactly matched to that of an InP substrate. This is indicated by point 20 in FIG. 2. As a matter of fact, it is possible to obtain quaternary III-V materials with exact lattice constant match to InP and with bandgaps ranging from 0.75 to 1.34 eV. This set of InGaAsP material is indicated in FIG. 2 by the heavy vertical line 21 drawn downwardly from the InP point. This lattice matching will give few dislocations, which will result in highly uniform junctions, and in uniform average gain across the junction, thereby reducing the noise generated by the first source of noise previously discussed.

The second advantage of the quarternary III-V alloy of InGaAsP as the active layer 4 is the improvement it offers in the distribution of gain, that is, a smaller spread in the number of electrons out of the device into the external circuit for one electron entering the avalanche region. This property of the InGaAsP material results from its desirable band structure.

As was shown by McIntyre, in IEEE Transactions On Electron Devices, Vol. 9, p. 703 (1972), the statistical noise fluctuation of the gain depends upon the ratio of the hole and electron ionization coefficients. For equal ionization coefficients the noise is proportional to $M^3$ where M is the average multiplication. For a very large ratio of ionization coefficients (ionization by one carrier only) the noise is proportional to $(2M^2-M)$. Thus for typical gains of $M = 300$ to 1,000, the noise characteristics are greatly improved with a large ratio of ionization coefficients. The ratio of ionization coefficients for a material depends on its band structure. With InGaAsP we are able to choose a material composition having the desired band structure for low noise operation.

Figure 3:
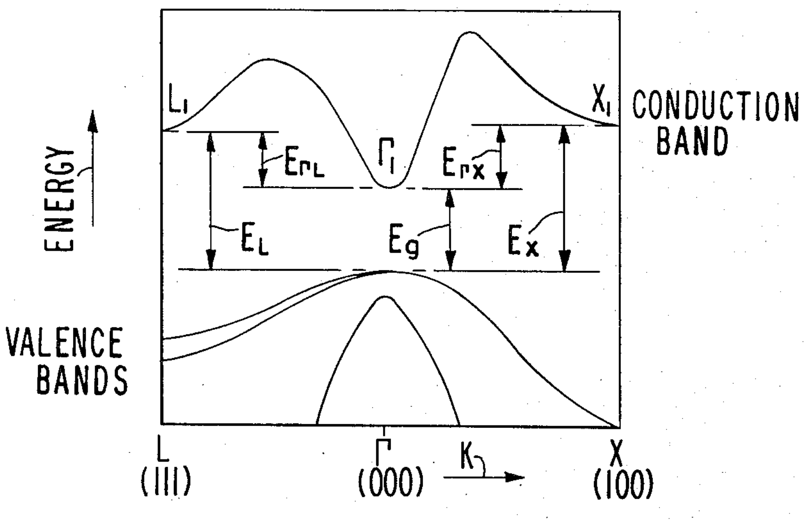
FIG. 3 is a plot of energy vs. momentum vector showing the conduction band and valance bands for a typical III-V alloy.
Figure 4:
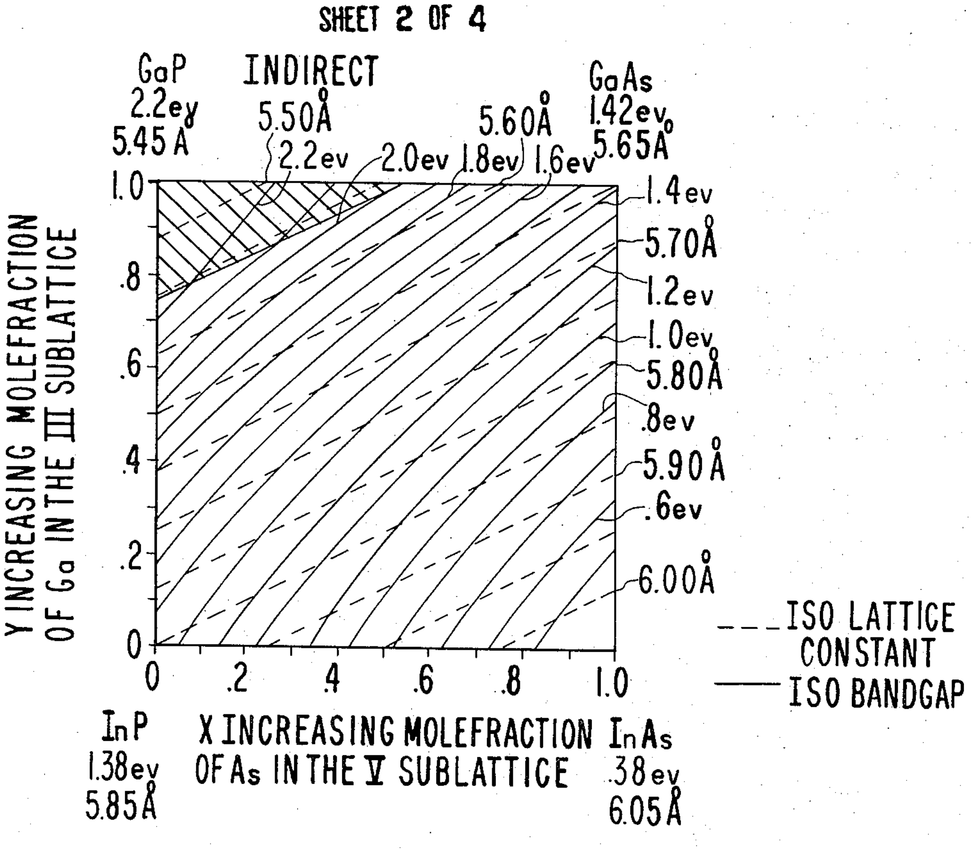
FIG. 4 is a plot of isobandgap lines and isolattice constant lines superimposed upon the compositional plane for the quaternary III-V alloy of $In_{1-y}Ga_yP_{1-x}As_x$.
Figure 5:
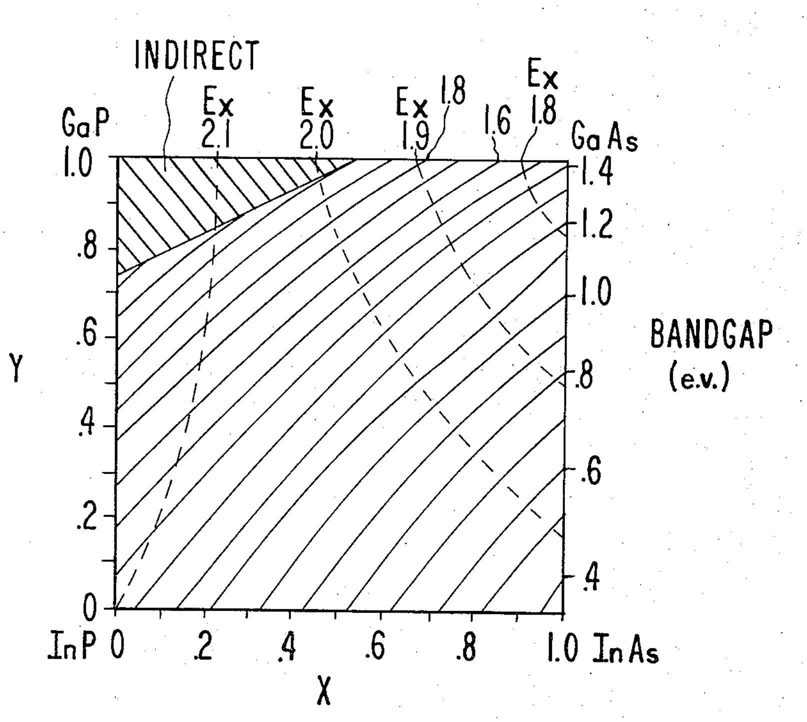
FIG. 5 is a plot of bandgap energy in electron volts and the X conduction band energy minima relative to the top of the valance band in electron volts superimposed upon the compositional plane for the InGaPAs quaternary III-V alloy.
Figure 6:
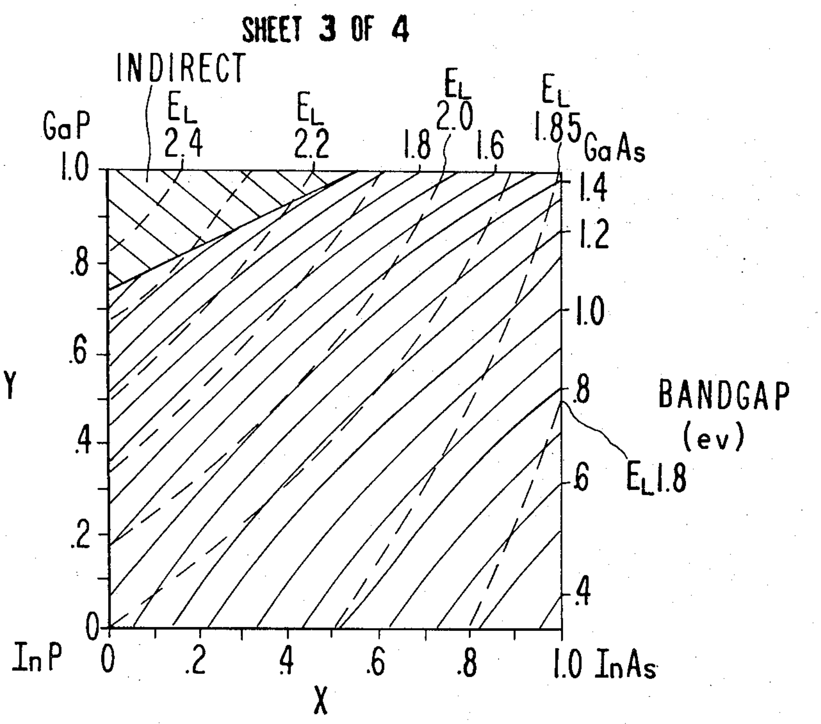
FIG. 6 is a plot similar to that of FIG. 5 depicting the $L_1$ conduction band energy minimum relative to the top of the valance band superimposed upon the compositional plane.

The band structure for a typical III-V material is shown in FIG. 3. The direct bandgap is indicated as $E_g$. The energies of the $X_1$ and $L_1$ conduction band minima are given relative to the top of the valence band by $E_X$ and $E_L$ respectively. FIG. 4 shows $E_g$ as a function of composition for InGaAsP. The lattice constant is also shown in FIG. 4. FIG. 5 shows the value of $E_X$ as a function of composition, and FIG. 6 shows the value of $E_L$.

The ratio of electron-to-hole ionization coefficients depends on the relationships among the energies of the conduction and minima. As electrons approach the high field region at the reverse biased p-n junction of the device, they are in a thermalized distribution at the bottom of the lowest conduction band minimum ($\Gamma_1$). Upon entering the high field region they will be accelerated to higher and higher energies in the $\Gamma_1$ minimum until one of two things happen. If they reach the energy of the next higher lying conduction band minima (either $X_1$ or $L_1$) before gaining sufficient energy to create an electron hole pair, they will be transferred by optical phonon scattering to one of those minima. This is the basis of the Gunn effect. The electrons will then continue to be accelerated in the upper minima until they reach a high enough energy to create an electron-hole pair. Because the $X_1$ and $L_1$ minima have effective masses very similar to that of the valence band, the electric field required to reach an energy sufficient to cause ionization is practically the same for holes and electrons, and materials of this type will have nearly equal hole and electron ionization coefficients. GaAs, GaAsSb, and InGaAs with bandgaps of 0.95 eV and above all fit into this class of material.

The other case, the low noise case, is where the band structure is such that an electron can gain enough energy in the Γ minimum to create an electron-hole pair without reaching the energy of the upper conduction band minima. In this case, because the effective mass in the Γ minimum is much lower than the valence band effective mass, a much lower electric field is required for electrons to reach ionization energy than for holes. Thus, the ratio of electron to hole ionization coefficients is very large. An avalance photodiode made from a material of this type will show much better noise performance. Another way of stating the same preferred condition is that the energy difference $E_{\Gamma X}$ and $E_{\Gamma L}$ between the lowest conduction band minimum ($\Gamma_1$) and the next higher conduction band minima either $X_1$ or $L_1$, is enough greater than the direct bandgap energy of the active layer 4 so that a hot electron is more likely to generate an electron-hole pair than to transfer by scattering to another conduction band minimum.

Figure 7:
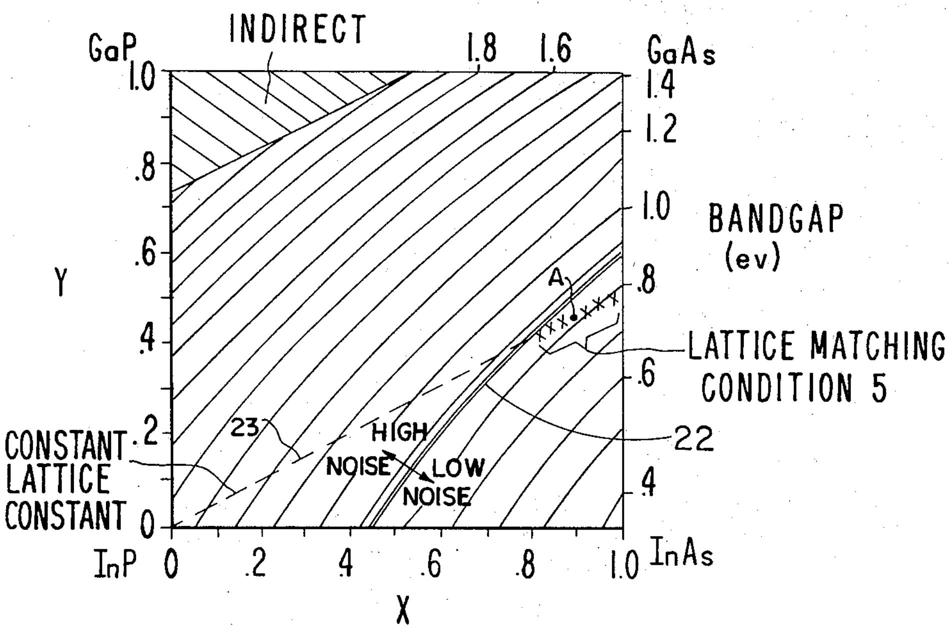
FIG. 7 is a plot of bandgap energy superimposed upon the compositional plane for a quaternary III-V alloy of InGaPAs depicting the lattice constant line for InP and the high noise and low noise region of the material when utilized as the active layer for avalanche diode use.
Figure 8:
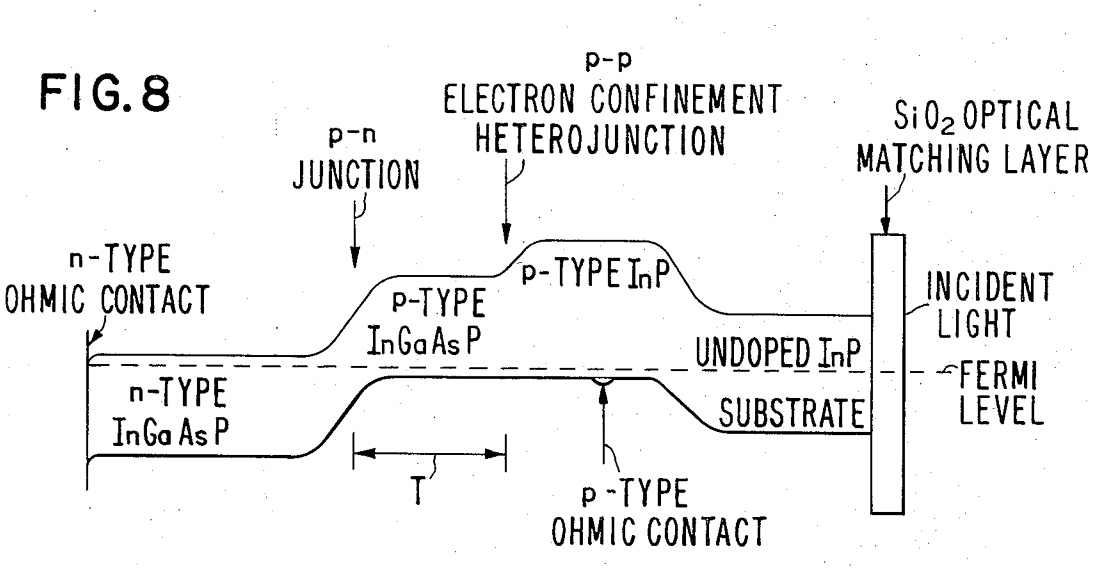
FIG. 8 is a plot of conduction band energy and valence band energy as a function of distance through the layers of the avalanche photodiode structure of FIG. 1.

The energy required for ionization is somewhat greater than the bandgap energy because momentum and energy must be conserved in the ionization event. For III-V direct bandgap materials, the required energy is about 1.1 times the bandgap energy, $E_g$. Thus, the requirements for a material to fit into the desirable category of the low noise case are that $E_{\Gamma X} > 1.1\ E_g$ and $E_{\Gamma L} > 1.1\ E_g$. As may be seen from FIGS. 4, 5 and 6, In GaAsP satisfies these conditions over part of its composition range. This is indicated in FIG. 7 by the broad solid line 22. Material with a composition below and to the right of line 22 satisfies the conditions for low noise avalanche gain. Materials to the left and above line 22 do not. Thus, the active layer 4 of the avalanche photodiode 1 should preferably be made of InGaAsP with composition falling to the right and below line 22.

Also shown in FIG. 7 is the constant lattice line 23 for those materials with an exact lattice method to InP. Notice that there exists a range of materials, indicated by the cross-hatched pattern 5 along line 23 in FIG. 7 which satisfies both the substrate lattice matching criteria and the band structure criteria for low noise gain. Thus, by causing the composition of the InGaAsP active layer material to fall within the cross-hatched region 5 of line 23 the avalanche photodiode 1 will have very uniform gain across the p-n junction and the lowest possible noise added by avalanche gain when the diode is constructed upon an InP substrate. A particularly suitable material falling within the cross-hatched region 5 of line 23 is that as indicated at point A having a composition of $In_{0.53}\ Ga_{0.47}\ As_{0.89}\ P_{0.11}$.

The epitaxial layers 3, 4 and 6 are grown, preferably by liquid phase epitaxy on the InP substrate 2. The procedure used for growing the epitaxial layers consists of preparing a series of In-Ga-As solutions with increasing amounts of Ga and then saturating the solution with P. Following equilibrium, the melt is brought in contact with a single crystal substrate of InP (which may be the (111) A or B oriented face of the (100) face of the material). Upon contacting the melt with the single crystal substrate at a suitable temperature, as of 650°C, a controlled cooling cycle is initiated for dropping the temperature by 25° to 50° depending upon the thickness of the epitaxial layer to be grown. Cooling rates may be varied between 2.0° and 0.1° C per minute with no apparent dependence of the surface structure of the peitaxial layer on cooling rate.

The lattice constant of the epitaxial layer is measured, for example, by X-ray deffraction of Cu-Kalpha radiation. Bandgap energy in the epitaxial layer is determined by photoluminescense techniques at both room temperature and reduced temperature, if desired. A typical device for measuring the bandgap energy is to illuminate the material with a monochromatic light source, such as a 0.5 watt argon ion laser beam and to observe the reflected light with a spectrophotometer, such as Perkin Elmer 301 spectrophotometer using a dry ice-cooled Spl photomultiplier.

A preferred method for growing the epitaxial layer is the conventional sliding bin method in a purified hydrogen atmosphere, according to the method of M.B. Panish et al as described in an article tilted "Preparation of Multi-layer LPE heterostructures with Crystalline Solid Solutions of $Al_x Ga_{1-x} As$ Heterostructure Lasers" appearing in the Metallurgical Transactions of the AIME, Volume 2, pages 795–801 (March 1971). A method for growing lattice matched layers of $In_{1-y} Ga_1 P_{1-x} As_y$ on III-V alloys of In, Ga, P, and As is disclosed and claimed in copending U.S. application filed and assigned to the same assignee as the present invention.

As used herein "lattice matched" means that the lattice constants are matched to within 0.5 percent, and "quaternary III-V alloy of InGaAsP" is defined to mean that the elements are proportioned according to the formula: $In_x Ga_{1-x} As_y P_{1-y}$.

What is claimed is:

1. An avalanche photodiode which responds to incident photons by providing photo-excited electrons which produce avalanche electrons, comprising:

a p-doped semiconductive layer for absorbing the incident photons to provide photo-excited electrons;

an n-doped semiconductive layer epitaxially interfaced and lattice matched with the p-doped layer for defining a p-n junction along the interface therebetween;

means for establishing a reverse bias across the p-n junction; and the p-doped semiconductive layer being made of $In_{1-y}Ga_yP_{1-x}As_x$ in which $y$ varies from about 0.6 to 0 and $x$ varies from about 0.45 to 1.0 and in which the lowest conduction band minima ($r_1$) and either of the next two lowest conduction band minima ($x_1$ or $L_1$) have an energy difference ($Erx$ or $Erl$) which is sufficiently greater than the bandgap energy of the p-doped semiconductive layer to establish a probability of greater than 0.5 that the photo-excited electrons within the p-doped layer will accelerate under the reverse bias and generate avalanche electrons, rather than transfer by phonon scattering to one of the conduction minima.

2. The photodiode of claim 1 wherein a substrate is provided for supporting the semiconductive layers.

3. The photodiode of claim 1 wherein $E_{rX}$ and $E_{rL}$ are greater than 1.1 times the direct bandgap energy of the p-doped layer.

4. The photodiode of claim 2 wherein the substrate portion is epitaxially interfaced to the photodiode and is made of a III-V alloy selected from the group consisting of In, Ga, P, and As.

5. The photodiode of claim 4, wherein the interfacing portion of the substrate portion is InP.

6. The photodiode of claim 4 wherein the interfacing portion of the substrate is made of a p-type InP material for making electrical contact to the p-doped semiconductive layer, and wherein the remainder of the substrate along the path of the incident photons is made of an undoped InP material to minimize unwanted free carrier absorption.

7. The photodiode of claim 6 including, an anti-reflection coating on the substrate disposed in alignment with the path of incident photons to avoid unwanted reflection of incident photons.

8. The photodiode of claim 5 wherein the material of the p-dope semiconductive layer is $In_{0.53}Ga_{0.47}As_{0.89}P_{0.11}$.

9. The photodiode of claim 5 wherein $y$ is greater than 0.40 and less than 0.55, and wherein $x$ is greater than 0.8 and less than 1.0.

10. The photodiode of claim 1 wherein both of the semiconductive layers are made of quaternary III-V alloys of $In_{1-y}Ga_yP_{1-x}As_x$.

* * * * *

UNITED STATES PATENT OFFICE

CERTIFICATE OF CORRECTION

Patent No. 3,821,777 Dated June 28, 1974

Inventor(s) Lawrence W. James

It is certified that error appears in the above-identified patent and that said Letters Patent are hereby corrected as shown below:

Claim 1, column 7, line 37,

Change "$r_1$" to -- $\mathbf{r}_1$ -- line 38, change "$x_1$" to -- $\mathbf{x}_1$ -- line 39, change "$E_{rx}$" or $E_{rL}$" to -- $E_{\mathbf{r}x}$ or $E_{\mathbf{r}L}$ --

Claim 3, column 8, line 10, change "$E_{rx}$ and $E_{rL}$" to -- $E_{\mathbf{r}x}$ and $E_{\mathbf{r}L}$ --

Signed and sealed this 10th day of June 1975.

(SEAL)
Attest:

RUTH C. MASON
Attesting Officer

C. MARSHALL DANN
Commissioner of Patents
and Trademarks